(12) United States Patent
Cheon

(10) Patent No.: US 12,464,915 B2
(45) Date of Patent: Nov. 4, 2025

(54) DISPLAY DEVICE

(71) Applicant: Samsung Display Co., Ltd., Yongin-si (KR)

(72) Inventor: Soohong Cheon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 815 days.

(21) Appl. No.: 17/721,657

(22) Filed: Apr. 15, 2022

(65) Prior Publication Data

US 2023/0051040 A1   Feb. 16, 2023

(30) Foreign Application Priority Data

Aug. 11, 2021 (KR) .................. 10-2021-0106149

(51) Int. Cl.
*H10K 59/131* (2023.01)
*H10D 86/40* (2025.01)
(Continued)

(52) U.S. Cl.
CPC ....... *H10K 59/1315* (2023.02); *H10D 86/481* (2025.01); *H10K 59/123* (2023.02); *H10K 59/126* (2023.02); *H10K 59/131* (2023.02); *H10K 59/80515* (2023.02); *H10K 59/80516* (2023.02); *H10K 59/80522* (2023.02);
(Continued)

(58) Field of Classification Search
CPC .. H10K 59/123; H10K 59/131; H10K 59/179; H10K 59/80517; H10K 59/82; H10K 59/84; H10K 59/1315; H10K 59/80515; H10K 59/35; H10K 59/38; H10K 59/8792; H10K 59/80516; H10K 59/80521; H10K 59/80522; H10K 59/126; H10D 86/441
See application file for complete search history.

(56) References Cited

U.S. PATENT DOCUMENTS

2002/0158835 A1* 10/2002 Kobayashi ........... H10K 50/818
                                                      345/100
2011/0156038 A1*  6/2011 Yang .................... H10D 86/481
                                                      257/E27.111
(Continued)

FOREIGN PATENT DOCUMENTS

KR         100776481 B1     11/2007
KR       1020180040185 A     4/2018
(Continued)

*Primary Examiner* — Yara B Green
*Assistant Examiner* — Akhee Sarker-Nag
(74) *Attorney, Agent, or Firm* — CANTOR COLBURN LLP

(57) ABSTRACT

A display device includes a first active pattern, a second active pattern spaced apart from the first active pattern in a plan view, a first connection pattern contacting the first active pattern, a second connection pattern contacting the second active pattern, a first pixel electrode, a second pixel electrode spaced apart from the first pixel electrode in the plan view, a common voltage pattern including a first protrusion portion protruding from a line portion in the plan view and overlapping the second connection pattern in a cross-sectional view, an emission layer disposed on the common voltage pattern, and a common electrode connecting the common voltage pattern.

20 Claims, 12 Drawing Sheets

(51) Int. Cl.
*H10K 59/123* (2023.01)
*H10K 59/126* (2023.01)
*H10K 59/35* (2023.01)
*H10K 59/38* (2023.01)
*H10K 59/80* (2023.01)

(52) U.S. Cl.
CPC ............ *H10K 59/35* (2023.02); *H10K 59/38* (2023.02); *H10K 59/8792* (2023.02)

(56) References Cited

U.S. PATENT DOCUMENTS

| | | | | |
|---|---|---|---|---|
| 2016/0064421 | A1* | 3/2016 | Oh | H10D 30/6745 |
| | | | | 257/43 |
| 2017/0345883 | A1* | 11/2017 | Song | H10K 59/123 |
| 2018/0261797 | A1 | 9/2018 | Lee | |
| 2023/0147751 | A1* | 5/2023 | Kang | G02F 1/136213 |

FOREIGN PATENT DOCUMENTS

| | | | |
|---|---|---|---|
| KR | 20180104225 | A | 9/2018 |
| KR | 102107565 | B1 | 5/2020 |

* cited by examiner

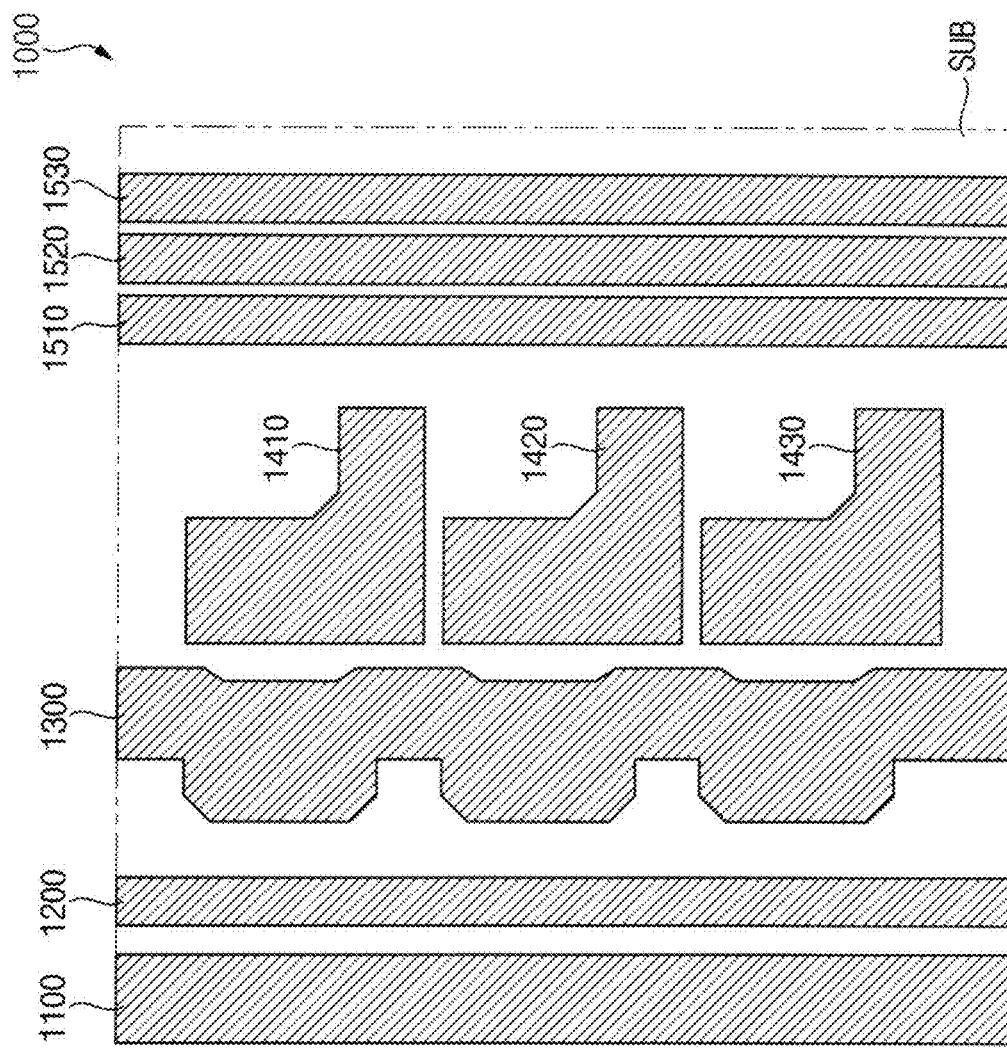
FIG. 4
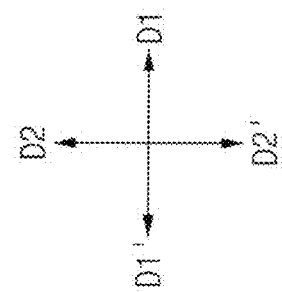

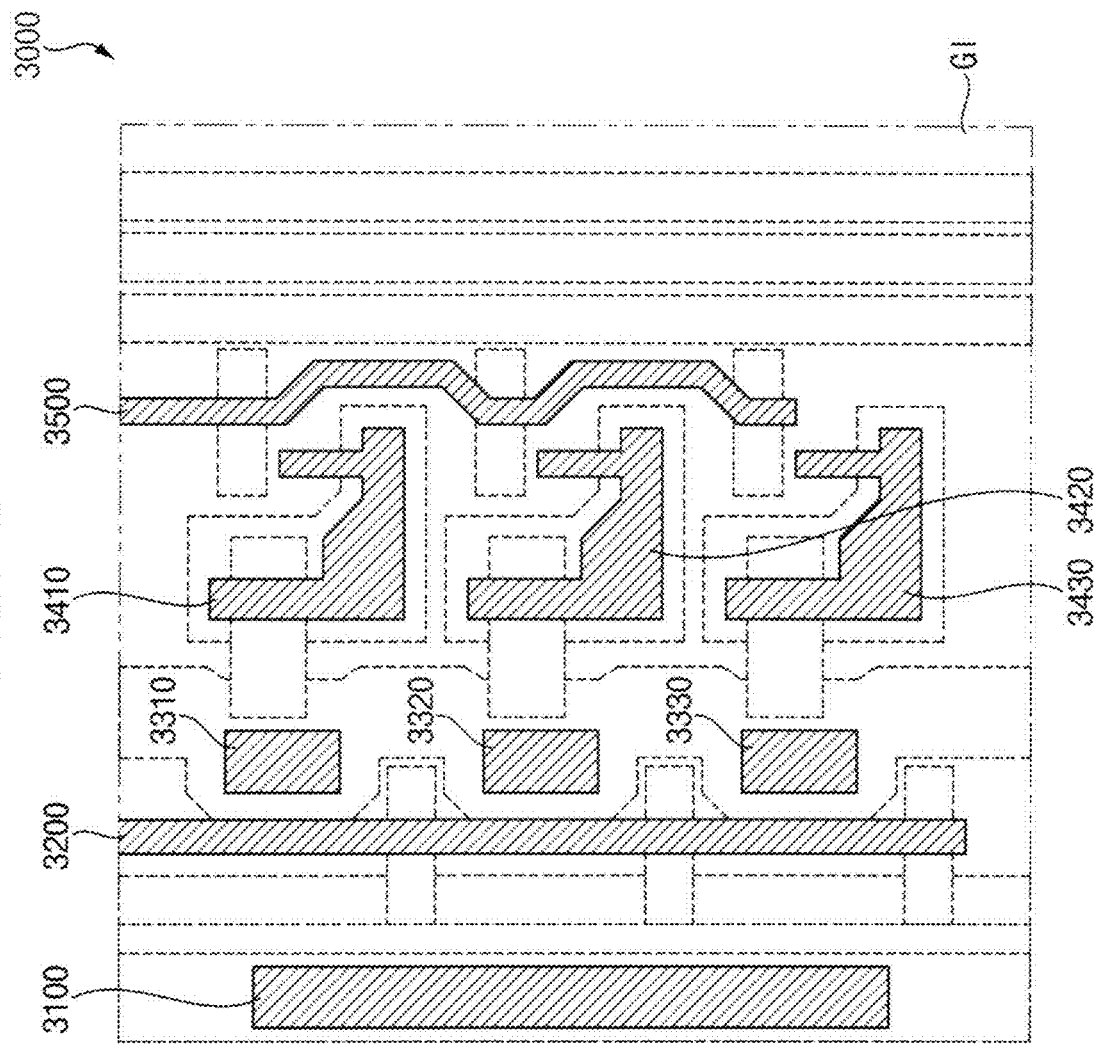
FIG. 6
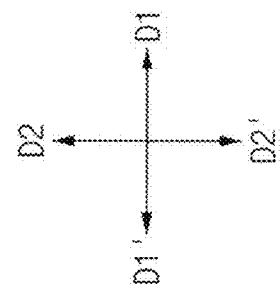

DISPLAY DEVICE

This application claims priority to Korean Patent Application No. 10-2021-0106149, filed on Aug. 11, 2021, and all the benefits accruing therefrom under 35 U.S.C. § 119, the content of which in its entirety is herein incorporated by reference.

BACKGROUND

1. Field

Embodiments of the invention relate generally to a display device.

2. Description of the Related Art

A display device includes a transistor layer and a light-emitting diode layer disposed on the transistor layer. The transistor layer has a structure in which conductive patterns overlap each other, and generates a driving current. Light-emitting diodes included in the light-emitting diode layer emit light by receiving the driving current. Each of the conductive patterns and the light-emitting diodes constitutes a sub-pixel. Recently, as a planar area of the sub-pixels is increasing and a distance between the sub-pixels is decreasing, the display device having improved display quality is being manufactured.

SUMMARY

Embodiments provide a display device with improved display quality.

A display device in an embodiment may include a first active pattern disposed on a substrate, a second active pattern disposed on the substrate, a first connection pattern disposed on the first active pattern and contacting the first active pattern, a second connection pattern disposed on the second active pattern and contacting the second active pattern, a first pixel electrode disposed on the first connection pattern, a second pixel electrode disposed on the second connection pattern, a common voltage pattern disposed on the second connection pattern and including a line portion extending in a first direction defining a plan view and a first protrusion portion protruding from the line portion in the plan view and overlapping the second connection pattern in a cross-sectional view, an emission layer disposed on the common voltage pattern, and a common electrode disposed on the emission layer and connected to the common voltage pattern. The second active pattern is spaced apart from the first active pattern in the plan view, the second pixel electrode is spaced apart from the first pixel electrode in the plan view, and the common voltage pattern is spaced apart from the second pixel electrode in the plan view In an embodiment, the first protrusion portion may protrude in a second direction intersecting the first direction and defining the plan view together with the first direction.

In an embodiment, the first protrusion portion may protrude toward the first pixel electrode.

In an embodiment, the first protrusion portion may be unitary with the line portion.

In an embodiment, the common voltage pattern may be disposed in a same layer as the first pixel electrode and the second pixel electrode.

In an embodiment, the display device may further include a first gate electrode disposed on the first active pattern and contacting the first connection pattern and a second gate electrode disposed on the second active pattern. The second gate electrode may be spaced apart from the first gate electrode in the plan view, and contact the second connection pattern.

In an embodiment, line portion may overlap the second gate electrode.

In an embodiment, the first connection pattern may connect the first active pattern and the first gate electrode, and the second connection pattern may connect the second active pattern and the second gate electrode.

In an embodiment, the display device may further include a first data line disposed on the substrate, extending in a second direction intersecting the first direction and defining the plan view together with the first direction, and connected to the second active pattern and a second data line disposed on the substrate, extending in the second direction, spaced apart from the first data line in the plan view, and connected to the first active pattern.

In an embodiment, the display device may further include a first data pattern disposed in a same layer as the first connection pattern and connecting the first active pattern and the second data line and a second data pattern disposed in a same layer as the second connection pattern and connecting the second active pattern and the first data line.

In an embodiment, the display device may further include a gate line disposed on the first active pattern and overlapping the first active pattern and the second active pattern. The gate line may extend in a second direction intersecting the first direction and defining the plan view together with the first direction In an embodiment, the display device may further include a gate connection line disposed on the gate line, extending in the first direction, and connected to the gate line.

In an embodiment, the common voltage pattern may further include a second protrusion portion and the second protrusion portion may protrude from the line portion and extends in a direction opposite to an extension direction of the first protrusion portion.

In an embodiment, the second protrusion portion may be unitary with the line portion and the first protrusion portion.

In an embodiment, the display device may further include a third pixel electrode facing the second pixel electrode with the second protrusion portion interposed therebetween.

In an embodiment, the common voltage pattern may be disposed in a same layer as the first pixel electrode, the second pixel electrode, and the third pixel electrode.

In an embodiment, the first pixel electrode may be electrically connected to the first connection pattern, and the second pixel electrode may be electrically connected to the second connection pattern.

In an embodiment, the common voltage pattern and the common electrode may be applied with a same common voltage.

In an embodiment, the line portion may be disposed between the first pixel electrode and the second pixel electrode, in a plan view.

In an embodiment, the first protrusion portion may shield the second connection pattern from the first pixel electrode.

Therefore, a display device according to embodiment of the invention may include a common voltage pattern disposed in the same layer as a pixel electrode and receiving a common voltage. The common voltage pattern may include a line portion and a protrusion portion. The line portion may extend in a first direction, and the protrusion portion may protrude from the line portion toward the pixel electrode. In addition, the protrusion portion may overlap a connection pattern disposed below. The connection pattern may be a configuration included in an adjacent sub-pixel, and may transmit a data voltage. As the protrusion portion is disposed between the pixel electrode and the connection pattern, a parasitic capacitance between the pixel electrode and the connection pattern may be reduced. Accordingly, stability of the data voltage transmitted through the connection pattern may be improved.

It is to be understood that both the foregoing general description and the following detailed description are examples and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention together with the description.

FIG. 4 to FIG. 9 are layout diagrams illustrating a pixel included in the display device of FIG. 1.

DETAILED DESCRIPTION

Figure 1:
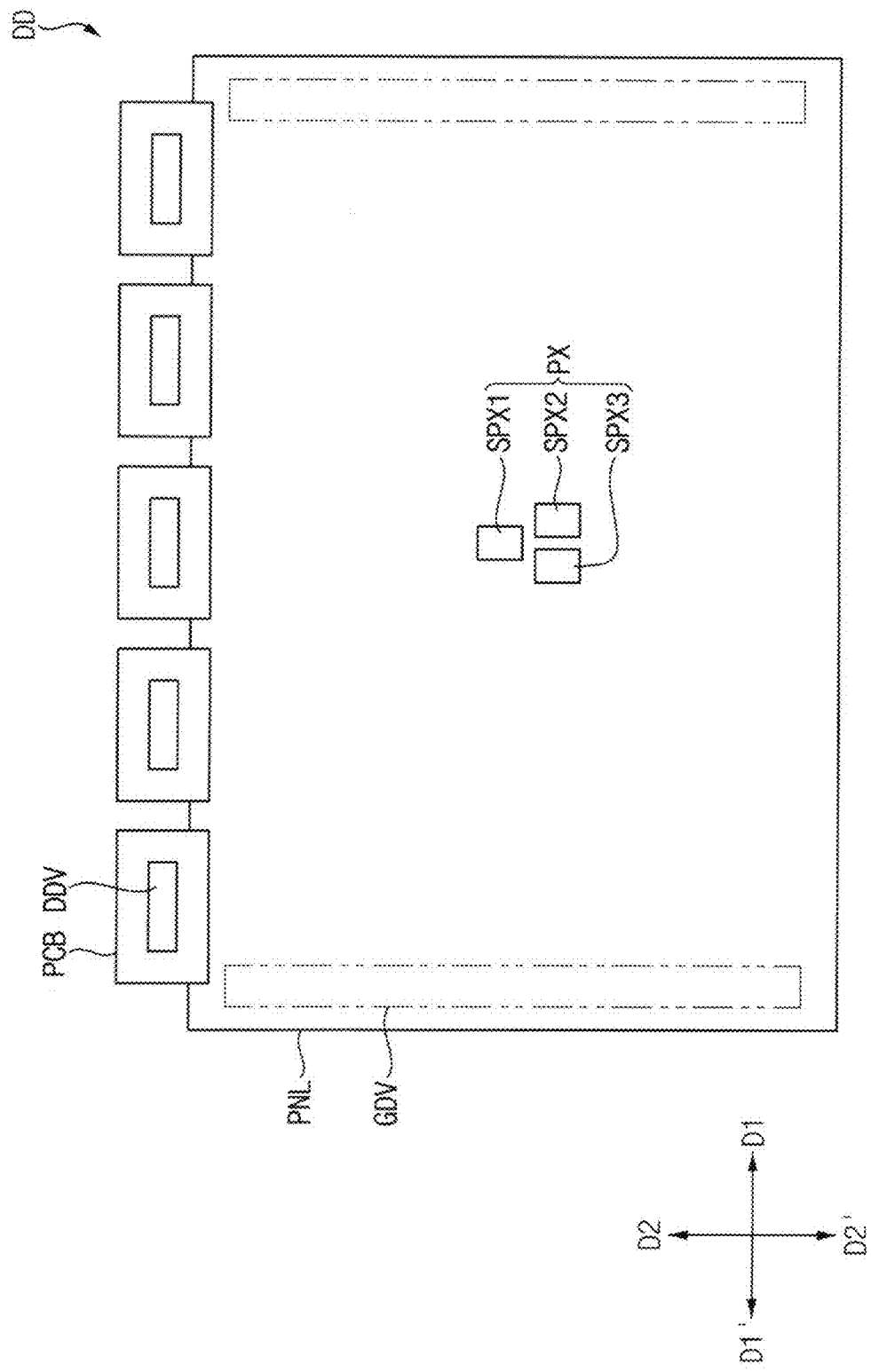
FIG. 1 is a plan view illustrating an embodiment of a display device.

Illustrative, non-limiting embodiments will be more clearly understood from the following detailed description in conjunction with the accompanying drawings.

It will be understood that when an element is referred to as being "on" another element, it can be directly on the other element or intervening elements may be therebetween. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. In an embodiment, when the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, when the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). The term "about" can mean within one or more standard deviations, or within ±30%, 20%, 10%, 5% of the stated value, for example.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the invention, and will not be interpreted in an idealized or overly formal sense unless expressly so defined herein.

Figure 2:
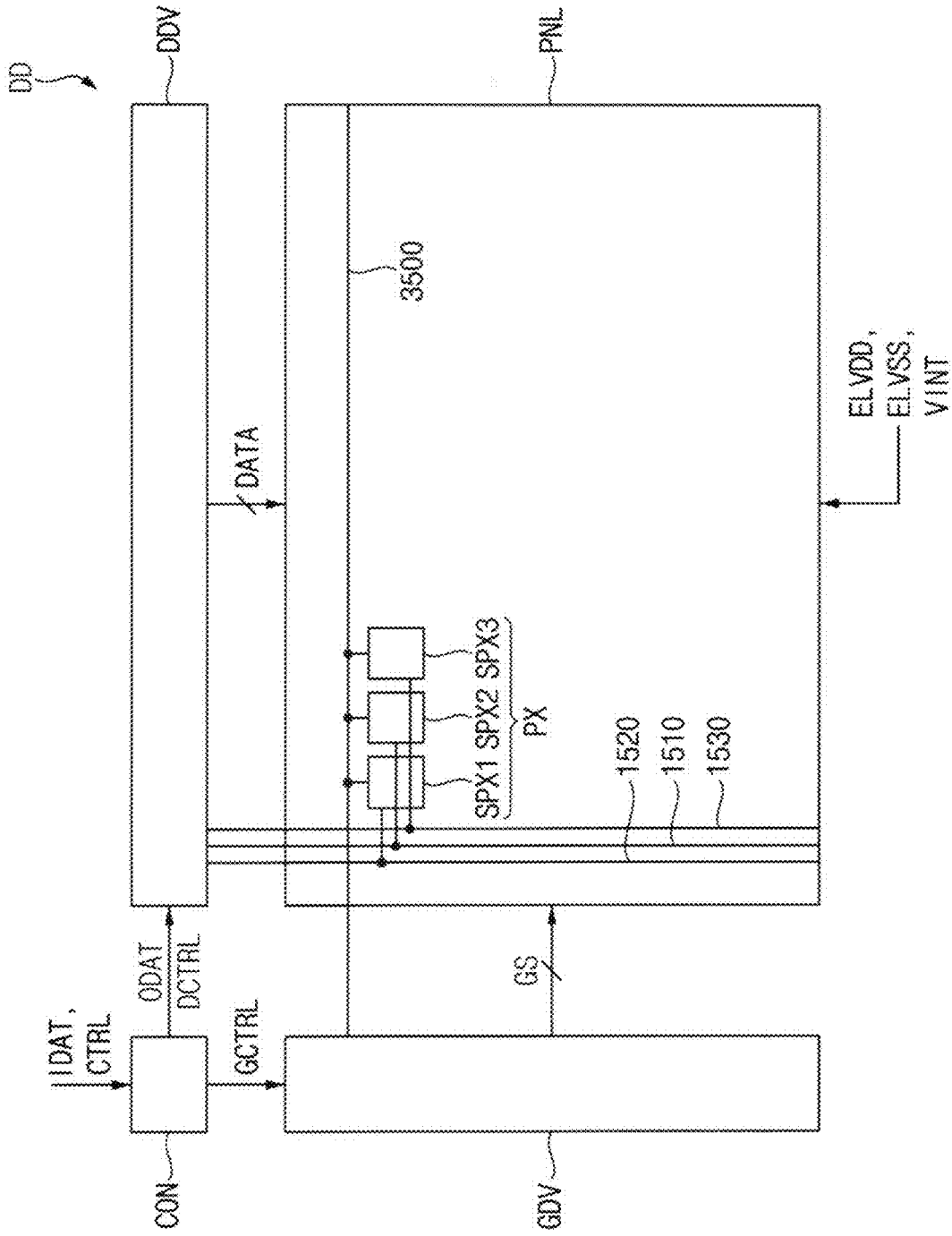
FIG. 2 is a block diagram illustrating the display device of FIG. 1.

FIG. 1 is a plan view illustrating an embodiment of a display device. FIG. 2 is a block diagram illustrating the display device of FIG. 1.

Referring to FIGS. 1 and 2, a display device DD in an embodiment of the invention may include a display panel PNL, a data driver DDV, a gate driver GDV, and a controller CON.

The display panel PNL may include a plurality of pixels. Each of the pixels may include a plurality of sub-pixels. In an embodiment, the pixel PX may include a first sub-pixel SPX1, a second sub-pixel SPX2, and a third sub-pixel SPX3. Each of the first sub-pixel SPX1, the second sub-pixel SPX2, and the third sub-pixel SPX3 may be applied with a data voltage DATA, a gate signal GS, a driving voltage ELVDD, a common voltage ELVSS, and an initialization voltage VINT, for example.

In an embodiment, the first sub-pixel SPX1 may receive the data voltage DATA through a second data line 1520 and may receive the gate signal GS through a gate line 3500. The second sub-pixel SPX2 may receive the data voltage DATA through a first data line 1510 and may receive the gate signal GS through the gate line 3500. The third sub-pixel SPX3 may receive the data voltage DATA through a third data line 1530 and may receive the gate signal GS through the gate line 3500.

The data driver DDV may generate the data voltage DATA based on an output image data ODAT and a data control signal DCTRL. In an embodiment, the data driver DDV may generate the data voltage DATA corresponding to the output image data ODAT and may output the data voltage DATA in response to the data control signal DCTRL, for example. The data control signal DCTRL may include an output data enable signal, a horizontal start signal, and a load signal.

In an embodiment, the data driver DDV may be connected to the display panel PNL through a printed circuit board PCB. In an embodiment, the data driver DDV may be implemented with a plurality of chips, and each of the chips may be attached to the printed circuit board PCB, for example. In another embodiment, the data driver DDV may be integrated in the display panel PNL.

The gate driver GDV may generate the gate signal GS based on a gate control signal GCTRL. The gate signal GS may include a first scan signal SC (refer to FIG. 3) and a second scan signal SS (refer to FIG. 3). In an embodiment, each of the first scan signal SC and the second scan signal SS may include a gate-on voltage for turning on the transistor and a gate-off voltage for turning off the transistor, for example. The gate control signal GCTRL may include a vertical start signal, a clock signal, or the like.

In an embodiment, the gate driver GDV may be integrated on both sides of the display panel PNL. In an embodiment, the gate driver GDV may be integrated on the left and right sides of the display panel PNL, for example. Accordingly, the response speed of the display panel PNL may be improved. In another embodiment, the gate driver GDV may be connected to the display panel PNL through a printed circuit board.

The controller CON (e.g., timing controller ("T-CON")) may receive input image data IDAT and a control signal CTRL from an external host processor (e.g., graphics processing unit ("GPU")). In an embodiment, the input image data IDAT may be RGB data including red image data, green image data, and blue image data, for example. The control signal CTRL may include a vertical synchronization signal, a horizontal synchronization signal, an input data enable signal, a master clock signal, or the like. The controller CON may generate the gate control signal GCTRL, the data control signal DCTRL, and the output image data ODAT based on the input image data IDAT and the control signal CTRL.

Figure 3:
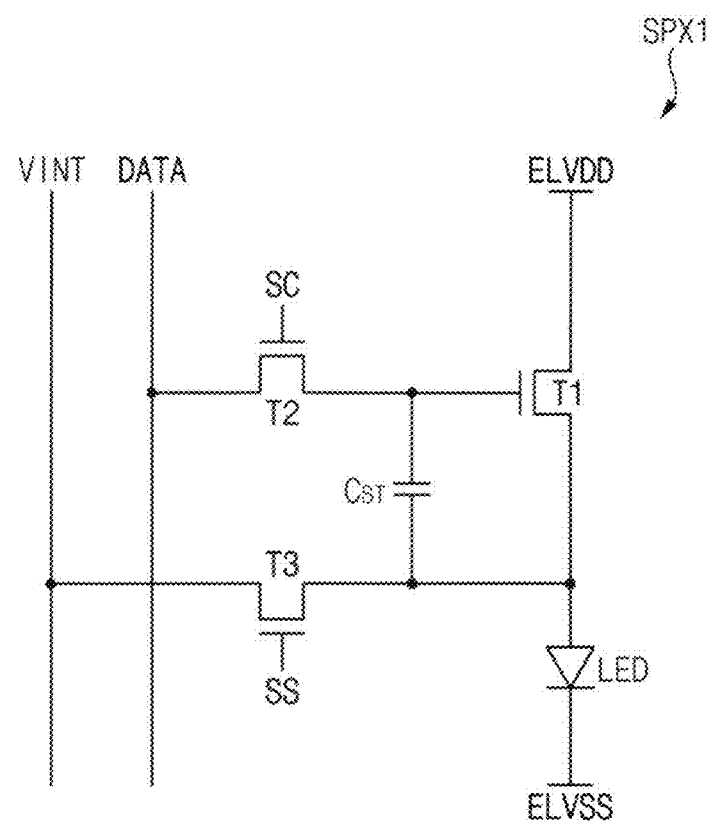
FIG. 3 is a circuit diagram illustrating a sub-pixel included in the display device of FIG. 1.

FIG. 3 is a circuit diagram illustrating a sub-pixel included in the display device of FIG. 1.

Referring to FIG. 3, the first sub-pixel SPX1 may include a first transistor T1, a second transistor T2, a third transistor T3, a storage capacitor $C_{ST}$, and a light-emitting diode LED. The second sub-pixel SPX2 and the third sub-pixel SPX3 may have substantially the same circuit structure as the first sub-pixel SPX1.

The first transistor T1 may include a first terminal, a second terminal, and a gate terminal. The first terminal may receive the driving voltage ELVDD. The second terminal may be connected to the light-emitting diode LED. The gate terminal may be connected to the second transistor T2. The first transistor T1 may generate a driving current based on the driving voltage ELVDD and the data voltage DATA.

The second transistor T2 may include a first terminal, a second terminal, and a gate terminal. The first terminal may receive the data voltage DATA. The second terminal may be connected to the first transistor T1. The gate terminal may receive the first scan signal SC. The second transistor T2 may transmit the data voltage DATA in response to the first scan signal SC.

The third transistor T3 may include a first terminal, a second terminal, and a gate terminal. The first terminal may be connected to the first transistor T1. The second terminal may receive the initialization voltage VINT. The gate terminal may receive the second scan signal SS. The third transistor T3 may transmit the initialization voltage VINT in response to the second scan signal SS.

The storage capacitor $C_{ST}$ may include a first terminal and a second terminal. The first terminal may be connected to the gate terminal of the first transistor T1. The second terminal may be connected to the first terminal of the third transistor T3. The storage capacitor $C_{ST}$ may maintain the voltage level of the gate terminal of the first transistor T1 during the inactivation period of the first scan signal SC.

The light-emitting diode LED may include a first terminal and a second terminal. The first terminal may be connected to the second terminal of the first transistor T1. The second terminal may receive the common voltage ELVSS. The light-emitting diode may emit light having a luminance corresponding to the driving current. The light-emitting diode LED may include an organic light-emitting diode using an organic material as an emission layer, an inorganic light-emitting diode using an inorganic material as an emission layer, or the like.

Figure 7:
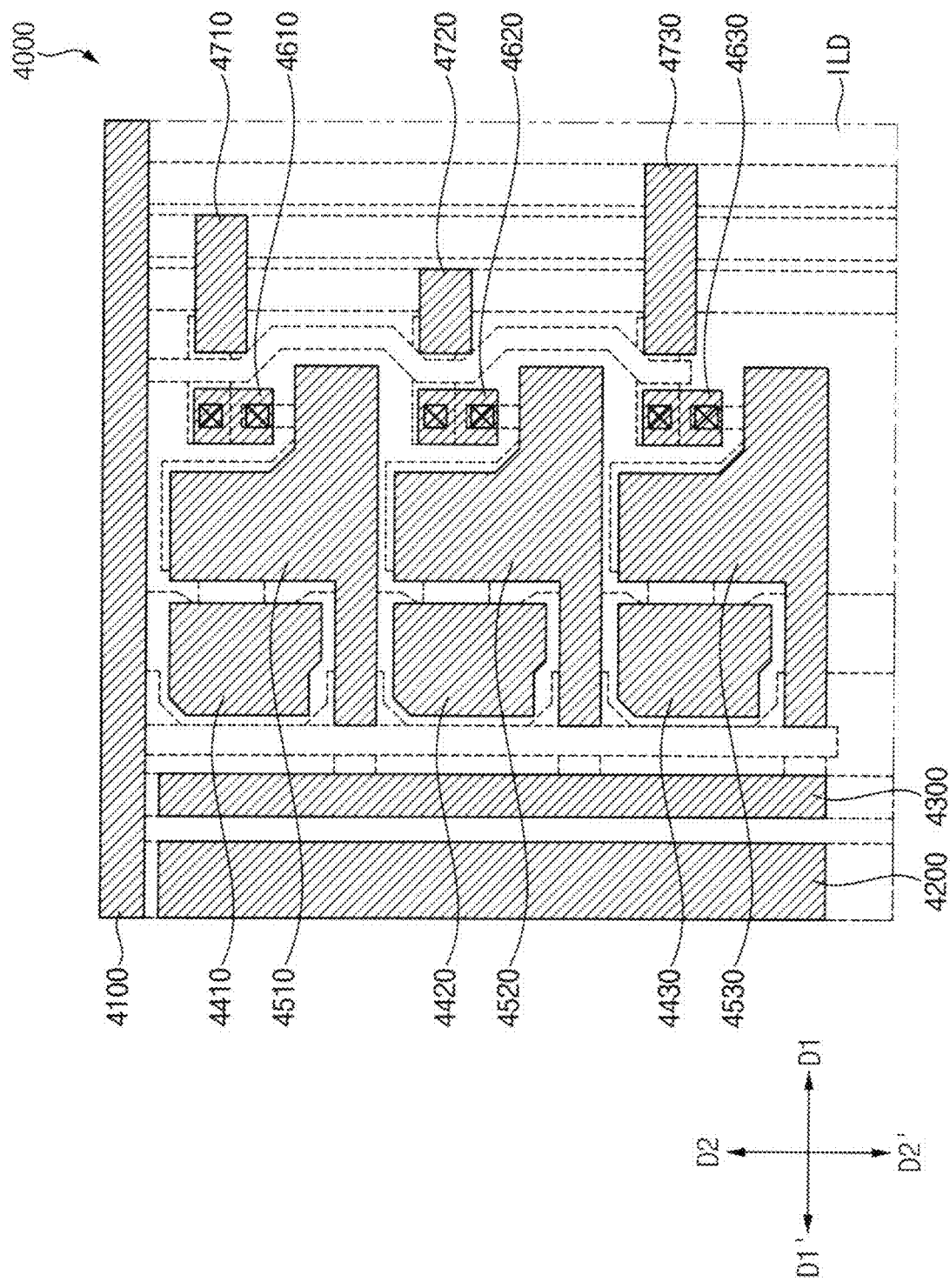
Figure 8:
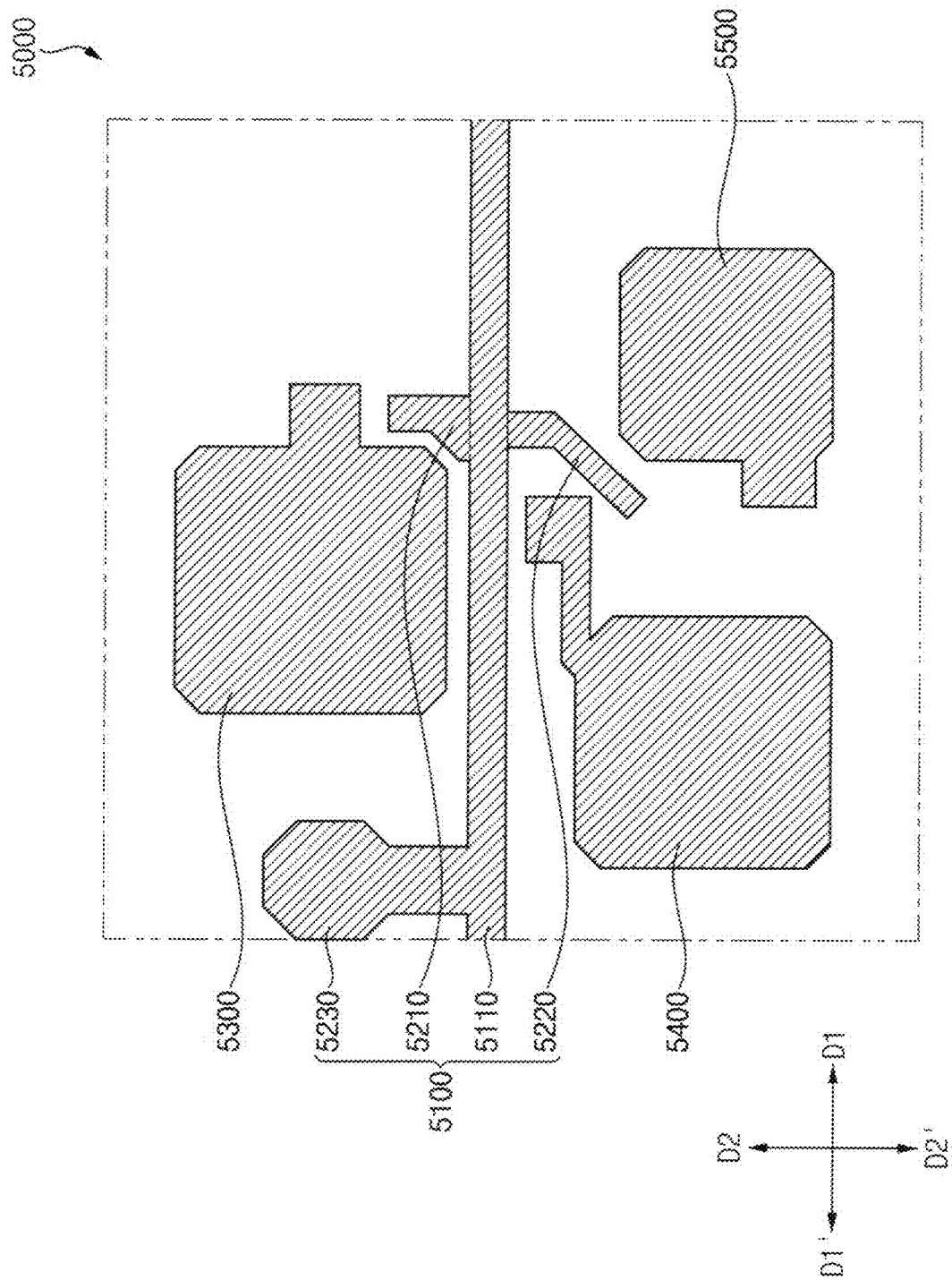

FIG. 4 to FIG. 9 are layout diagrams illustrating a pixel included in the display device of FIG. 1. FIGS. 4, 5, 6, 7, and 9 are layout diagrams illustrating a plurality of stacked conductive patterns and FIG. 8 is a layout diagram illustrating a fourth conductive pattern.

Referring to FIG. 4, the pixel PX may include a substrate SUB and a first conductive pattern 1000. The first conductive pattern 1000 may be disposed on the substrate SUB, and may include a common voltage line 1100, an initialization voltage line 1200, a driving voltage line 1300, and a first capacitor electrode pattern 1410, a second capacitor electrode pattern 1420, a third capacitor electrode pattern 1430, a first data line 1510, a second data line 1520, and a third data line 1530.

The substrate SUB may include a transparent or opaque material. In an embodiment, the material that may be used as the substrate SUB may include glass, quartz, plastic, or the like. These may be used alone or in combination with each other.

The common voltage line 1100 may be disposed on the substrate SUB and may extend in a second direction D2 and a second opposite direction D2' opposite to the second direction D2. The common voltage line 1100 may provide the common voltage ELVSS to the first to third sub-pixels SPX1, SPX2, and SPX3.

The initialization voltage line 1200 may be disposed on the substrate SUB and may extend in the second direction D2 and the second opposite direction D2'. The initialization voltage line 1200 may be spaced apart from the common voltage line 1100 in the first direction D1 (or a first opposite direction D1'), and may provide the initialization voltage VINT to the first to third sub-pixels SPX1, SPX2, and SPX3.

The driving voltage line 1300 may be disposed on the substrate SUB and may extend in the second direction D2 and the second opposite direction D2'. The driving voltage line 1300 may be spaced apart from the initialization voltage line 1200 in the first direction D1 (or a first opposite direction D1'), and may provide the driving voltage ELVDD to the first to third sub-pixels SPX1, SPX2, and SPX3.

The first capacitor electrode pattern 1410 may be disposed on the substrate SUB and may be spaced apart from the driving voltage line 1300 in the first direction D1 (or a first opposite direction D1'). In an embodiment, the first capacitor electrode pattern 1410 may be electrically connected to the initialization voltage line 1200. In an embodiment, the first capacitor electrode pattern 1410 may correspond to the second terminal of the storage capacitor $C_{ST}$ included in the first sub-pixel SPX1 described with reference to FIG. 3, for example.

In addition, the second capacitor electrode pattern 1420 may be spaced apart from the first capacitor electrode pattern 1410 in the second opposite direction D2', and may correspond to a second terminal of the storage capacitor included in the second sub-pixel SPX2. The third capacitor electrode pattern 1430 may be spaced apart from the second capacitor electrode pattern 1420 in the second opposite direction D2', and may correspond to a second terminal of the storage capacitor included in the third sub-pixel SPX3.

The first data line 1510 may be disposed on the substrate SUB and may extend in the second direction D2 and the second opposite direction D2'. The first data line 1510 may provide the data voltage DATA to the second sub-pixel SPX2.

In addition, the second data line 1520 may be spaced apart from the first data line 1510 in the first direction D1 (or a first opposite direction D1'), and may provide the data voltage DATA to the first sub-pixel SPX1. The third data line 1530 may be spaced apart from the second data line 1520 in the first direction D1 (or a first opposite direction D1'), and may provide the data voltage DATA to the third sub-pixel SPX3.

However, the connection relationship between the first to third data lines 1510, 1520, and 1530 and the first to third sub-pixels SPX1, SPX2, and SPX3 is not limited thereto. A connection relationship between the first to third data lines 1510, 1520, and 1530 and the first to third sub-pixels SPX1, SPX2, and SPX3 may be appropriately set as necessary.

In an embodiment, the first conductive pattern 1000 may include a metal, an alloy, a conductive metal oxide, a transparent conductive material, or the like. In an embodiment, the material that may be used as the first conductive pattern 1000 may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), indium tin oxide ("ITO"), indium zinc oxide ("IZO"), or the like. These may be used alone or in combination with each other. In addition, the first conductive pattern 1000 may include a single layer or a multilayer.

Figure 5:
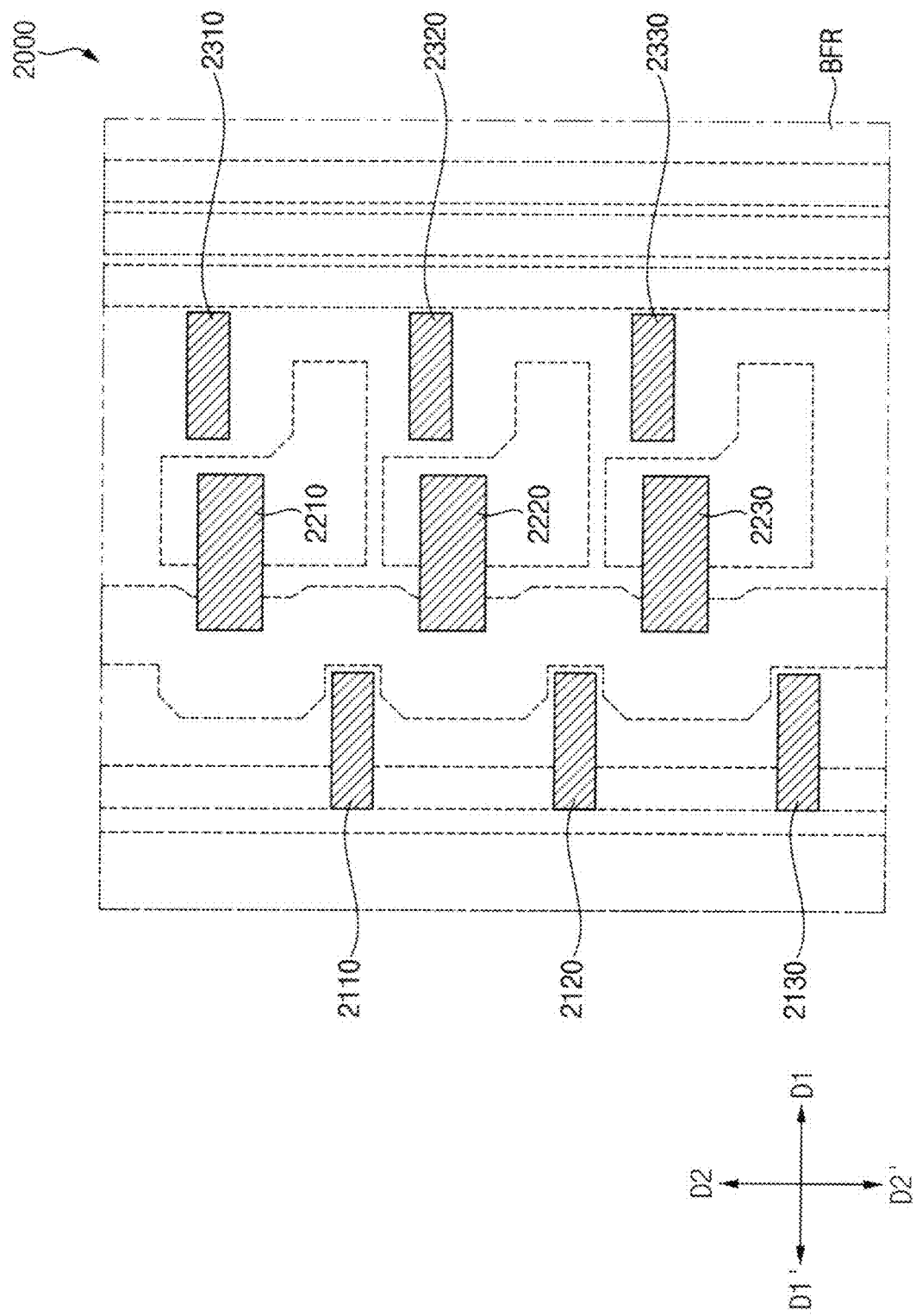

Referring to FIG. 5 along with FIG. 4, a buffer layer BFR may be disposed on the first conductive pattern 1000 and may cover the first conductive pattern 1000. The buffer layer BFR may prevent metal atoms, atoms, or impurities from diffusing from the substrate SUB into a semiconductor pattern 2000. In addition, the buffer layer BFR may control a heat supply rate during a crystallization process for forming the semiconductor pattern 2000.

The semiconductor pattern 2000 may be disposed on the buffer layer BFR, and may include a first semiconductor pattern 2110, a second semiconductor pattern 2120, a third semiconductor pattern 2130, a fourth semiconductor pattern 2210, a fifth semiconductor pattern 2220, a sixth semiconductor pattern 2230, a first active pattern 2310, a second active pattern 2320, and a third active pattern 2330.

The first semiconductor pattern 2110, the second semiconductor pattern 2120, and the third semiconductor pattern 2130 may be arranged along the second direction D2 (or the second opposite direction D2'), and may overlap the initialization voltage line 1200.

In an embodiment, the first semiconductor pattern 2110 may be electrically connected to the initialization voltage line 1200, and may transmit the initialization voltage VINT to the first sub-pixel SPX1. In an embodiment, the first semiconductor pattern 2110 may correspond to the first terminal and the second terminal of the third transistor T3 included in the first sub-pixel SPX1, for example.

In addition, the second semiconductor pattern 2120 may be electrically connected to the initialization voltage line 1200, and may transmit the initialization voltage VINT to the second sub-pixel SPX2. The third semiconductor pattern 2130 may be electrically connected to the initialization voltage line 1200, and may transmit the initialization voltage VINT to the third sub-pixel SPX3.

The fourth semiconductor pattern 2210, the fifth semiconductor pattern 2220, and the sixth semiconductor pattern 2230 may be arranged along the second direction D2 (or the second opposite direction D2'), and may overlap first capacitor electrode pattern 1410, the second capacitor electrode pattern 1420, and the third capacitor electrode pattern 1430, respectively.

In an embodiment, the fourth semiconductor pattern 2210 may be electrically connected to the driving voltage line 1300, and may transmit the driving voltage ELVDD to the first sub-pixel SPX1. In an embodiment, the fourth semiconductor pattern 2210 may correspond to the first terminal and the second terminal of the first transistor T1 included in the first sub-pixel SPX1, for example.

In addition, the fifth semiconductor pattern 2220 may be electrically connected to the driving voltage line 1300, and may transmit the driving voltage ELVDD to the second sub-pixel SPX2. The sixth semiconductor pattern 2230 may be electrically connected to the driving voltage line 1300, and may transmit the driving voltage ELVDD to the third sub-pixel SPX3.

The first active pattern 2310, the second active pattern 2320, and the third active pattern 2330 may be arranged in the second direction D2 (or the second opposite direction D2').

In an embodiment, the first active pattern 2310 may be electrically connected to the second data line 1520, and may transmit the data voltage DATA to the first sub-pixel SPX1. In an embodiment, the first active pattern 2310 may correspond to the first terminal and the second terminal of the second transistor T2 included in the first sub-pixel SPX1, for example.

In addition, the second active pattern 2320 may be electrically connected to the first data line 1510, and may transmit the data voltage DATA to the second sub-pixel SPX2. The third active pattern 2330 may be electrically connected to the third data line 1530, and may transmit the data voltage DATA to the third sub-pixel SPX3.

In an embodiment, the semiconductor pattern 2000 may include a silicon semiconductor material or an oxide semiconductor material. In an embodiment, the silicon semiconductor material that may be used as the semiconductor pattern 2000 may include amorphous silicon, polycrystalline silicon, or the like. In an embodiment, the oxide semiconductor material that may be used as the semiconductor pattern 2000 may be indium gallium zinc oxide ("IGZO") (InGaZnO), indium tin zinc oxide ("ITZO") (InSnZnO), or the like. In addition, the oxide semiconductor material may further include indium (In), gallium (Ga), tin (Sn), zirconium (Zr), vanadium (V), hafnium (Hf), cadmium (Cd), germanium (Ge), chromium (Cr), titanium (Ti), and zinc (Zn). These may be used alone or in combination with each other.

Referring to FIG. 6 along with FIGS. 4 and 5, a gate insulating layer GI may be disposed on the semiconductor pattern 2000 and may cover the semiconductor pattern 2000. In an embodiment, the gate insulating layer GI may include an insulating material. In an embodiment, the insulating material that may be used as the gate insulating layer GI may include silicon oxide, silicon nitride, silicon oxynitride, or the like. These may be used alone or in combination with each other.

A second conductive pattern 3000 may be disposed on the gate insulating layer GI, and may include a first double pattern 3100, an initialization gate line 3200, a second double pattern 3310, a third double pattern 3320, a fourth double pattern 3330, a first gate electrode 3410, a second gate electrode 3420, a third gate electrode 3430, and a gate line 3500.

The first double pattern 3100 may overlap the common voltage line 1100 and may extend in the second direction D2 (or the second opposite direction D2'). The first double pattern 3100 may be electrically connected to the common voltage line 1100. The first double pattern 3100 may reduce an electrical resistance of the common voltage line 1100. Accordingly, a voltage drop of the common voltage ELVSS may be prevented.

The initialization gate line 3200 may extend in the second direction D2 (or the second opposite direction D2'), and may overlap the first semiconductor pattern 2110, the second semiconductor pattern 2120, and the third semiconductor pattern 2130. The initialization gate line 3200 may provide the second scan signal SS (refer to FIG. 3) to the first sub-pixel SPX1, the second sub-pixel SPX2, and the third sub-pixel SPX3.

The second double pattern 3310, the third double pattern 3320, and the fourth double pattern 3330 may be arranged in the second direction D2 (or the second opposite direction D2'), and may overlap the driving voltage line 1300. The second double pattern 3310, the third double pattern 3320, and the fourth double pattern 3330 may be electrically connected to the driving voltage line 1300, and may reduce an electrical resistance of the driving voltage line 1300. Accordingly, a voltage drop of the driving voltage ELVDD may be prevented.

The first gate electrode 3410, the second gate electrode 3420, and the third gate electrode 3430 may be arranged in the second direction D2 (or the second opposite direction D2').

In an embodiment, the first gate electrode 3410 may be electrically connected to the first active pattern 2310 and may overlap the fourth semiconductor pattern 2210. Accordingly, the first gate electrode 3410 may correspond to the gate terminal of the first transistor T1 included in the first sub-pixel SPX1.

In addition, the second gate electrode 3420 may be electrically connected to the second active pattern 2320 and may overlap the fifth semiconductor pattern 2220. The third gate electrode 3430 may be electrically connected to the third active pattern 2330 and may overlap the sixth semiconductor pattern 2230.

In an embodiment, the first gate electrode 3410 may overlap the first capacitor electrode pattern 1410. Accordingly, the first gate electrode 3410 may correspond to the first terminal of the storage capacitor $C_{ST}$ included in the first sub-pixel SPX1.

In addition, the second gate electrode 3420 may overlap the second capacitor electrode pattern 1420. The third gate electrode 3430 may overlap the third capacitor electrode pattern 1430.

The gate line 3500 may extend in the second direction D2 (or the second opposite direction D2'), and may overlap the first active pattern 2310, the second active pattern 2320, and the third active pattern 2330. The gate line 3500 may provide the first scan signal SC (refer to FIG. 3) to the first sub-pixel SPX1, the second sub-pixel SPX2, and the third sub-pixel SPX3. In other words, the gate line 3500 may correspond to the gate terminal of the second transistor T2 described with reference to FIG. 3.

The second conductive pattern 3000 may include a metal, an alloy, a conductive metal oxide, a transparent conductive material, or the like. In an embodiment, the material that may be used as the second conductive pattern 3000 may include silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In addition, the second conductive pattern 3000 may include a single layer or a multilayer.

Referring to FIG. 7, an inter-insulating layer ILD may be disposed on the second conductive pattern 3000 and may cover the second conductive pattern 3000. In an embodiment, the inter-insulating layer ILD may include an insulating material. In an embodiment, the insulating material that may be used as the inter-insulating layer ILD include silicon oxide, silicon nitride, silicon oxynitride, or the like. These may be used alone or in combination with each other. In addition, the inter-insulating layer ILD may include a single layer or a multilayer.

A third conductive pattern 4000 may be disposed on the inter-insulating layer ILD, and may include a gate connection line 4100, a common voltage connection pattern 4200, an initialization voltage connection pattern 4300, a first driving voltage connection pattern 4410, a second driving voltage connection pattern 4420, a third driving voltage connection pattern 4430, a first anode pad 4510, a second anode pad 4520, a third anode pad 4530, a first connection pattern 4610, a second connection pattern 4620, a third connection pattern 4630, a first data pattern 4710, a second data pattern 4720, and a third data pattern 4730.

The gate connection line 4100 may extend in a first direction D1 intersecting the second direction D2. The gate connection line 4100 may contact the gate line 3500 through at least one contact hole. The gate connection line 4100 may transmit the first scan signal SC to the gate line 3500.

The common voltage connection pattern 4200 may overlap the common voltage line 1100 and the first double pattern 3100 and may extend in the second direction D2 (or the second opposite direction D2'). The common voltage connection pattern 4200 may contact the common voltage line 1100 and the first double pattern 3100 through at least one contact hole.

The initialization voltage connection pattern 4300 may overlap the initialization voltage line 1200 and may extend in the second direction D2. The initialization voltage connection pattern 4300 may contact the initialization voltage line 1200, the first semiconductor pattern 2110, the second semiconductor pattern 2120, and the third semiconductor pattern 2130 through at least one contact hole. The initialization voltage connection pattern 4300 may transmit the initialization voltage VINT from the initialization voltage line 1200 to the first to third semiconductor patterns 2110, 2120, and 2130.

The first driving voltage connection pattern 4410, the second driving voltage connection pattern 4420, and the third driving voltage connection pattern 4430 may be arranged in the second direction D2 (or the second opposite direction D2').

The first driving voltage connection pattern 4410 may contact the driving voltage line 1300, the fourth semiconductor pattern 2210, and the second double pattern 3310 through at least one contact hole. The first driving voltage connection pattern 4410 may transmit the driving voltage ELVDD from the driving voltage line 1300 to the fourth semiconductor pattern 2210.

The second driving voltage connection pattern 4420 may contact the driving voltage line 1300, the fifth semiconductor pattern 2220, and the third double pattern 3320 through at least one contact hole. The second driving voltage connection pattern 4420 may transmit the driving voltage ELVDD from the driving voltage line 1300 to the fifth semiconductor pattern 2220.

The third driving voltage connection pattern 4430 may contact the driving voltage line 1300, the sixth semiconductor pattern 2230, and the fourth double pattern 3330 through at least one contact hole. The third driving voltage connection pattern 4430 may transmit the driving voltage ELVDD from the driving voltage line 1300 to the sixth semiconductor pattern 2230.

The first anode pad 4510, the second anode pad 4520, and the third anode pad 4530 may be arranged in the second direction D2 (or the second opposite direction D2').

The first anode pad 4510 may contact the first capacitor electrode pattern 1410, the first semiconductor pattern 2110, and the fourth semiconductor pattern 2210 through at least one contact hole. The first anode pad 4510 may transmit the initialization voltage VINT from the first semiconductor pattern 2110 to the first capacitor electrode pattern 1410.

The second anode pad 4520 may contact the second capacitor electrode pattern 1420, the second semiconductor pattern 2120, and the fifth semiconductor pattern 2220 through at least one contact hole.

The third anode pad 4530 may contact the third capacitor electrode pattern 1430, the third semiconductor pattern 2130, and the sixth semiconductor pattern 2230 through at least one contact hole.

The first connection pattern 4610, the second connection pattern 4620, and the third connection pattern 4630 may be arranged in the second direction D2 (or the second opposite direction D2').

In an embodiment, the first connection pattern 4610 may overlap the first active pattern 2310 and the first gate electrode 3410. In addition, the first connection pattern 4610 may contact the first active pattern 2310 and the first gate electrode 3410 through at least one contact hole. In other words, the first connection pattern 4610 may connect the first active pattern 2310 and the first gate electrode 3410. Accordingly, the first connection pattern 4610 may transmit the data voltage DATA from the first active pattern 2310 to the first gate electrode 3410.

In an embodiment, the second connection pattern 4620 may overlap the second active pattern 2320 and the second gate electrode 3420. In addition, the second connection pattern 4620 may contact the second active pattern 2320 and the second gate electrode 3420 through at least one contact hole. In other words, the second connection pattern 4620 may connect the second active pattern 2320 and the second gate electrode 3420. Accordingly, the second connection pattern 4620 may transmit the data voltage DATA from the second active pattern 2320 to the second gate electrode 3420.

In an embodiment, the third connection pattern 4630 may overlap the third active pattern 2330 and the third gate electrode 3430. In addition, the third connection pattern 4630 may contact the third active pattern 2330 and the third gate electrode 3430 through at least one contact hole. In other words, the third connection pattern 4630 may connect the third active pattern 2330 and the third gate electrode 3430. Accordingly, the third connection pattern 4630 may transmit the data voltage DATA from the third active pattern 2330 to the third gate electrode 3430.

The first data pattern 4710, the second data pattern 4720, and the third data pattern 4730 may be arranged in the second direction D2 (or the second opposite direction D2').

The first data pattern 4710 may contact the second data line 1520 and the first active pattern 2310 through at least one contact hole. The first data pattern 4710 may transmit the data voltage DATA from the second data line 1520 to the first active pattern 2310.

The second data pattern 4720 may contact the first data line 1510 and the second active pattern 2320 through at least one contact hole. The second data pattern 4720 may transmit the data voltage DATA from the first data line 1510 to the second active pattern 2320.

The third data pattern 4730 may contact the third data line 1530 and the third active pattern 2330 through at least one contact hole. The third data pattern 4730 may transmit the data voltage DATA from the third data line 1530 to the third active pattern 2330.

The third conductive pattern 4000 may include a metal, an alloy, a conductive metal oxide, a transparent conductive material, or the like. In an embodiment, the material that may be used as the third conductive pattern 4000 may be silver (Ag), an alloy including silver, molybdenum (Mo), an alloy including molybdenum, aluminum (Al), an alloy including aluminum, aluminum nitride (AlN), tungsten (W), tungsten nitride (WN), copper (Cu), nickel (Ni), chromium (Cr), chromium nitride (CrN), titanium (Ti), tantalum (Ta), platinum (Pt), scandium (Sc), ITO, IZO, or the like. These may be used alone or in combination with each other. In addition, the third conductive pattern 4000 may include a single layer or a multilayer.

Figure 9:
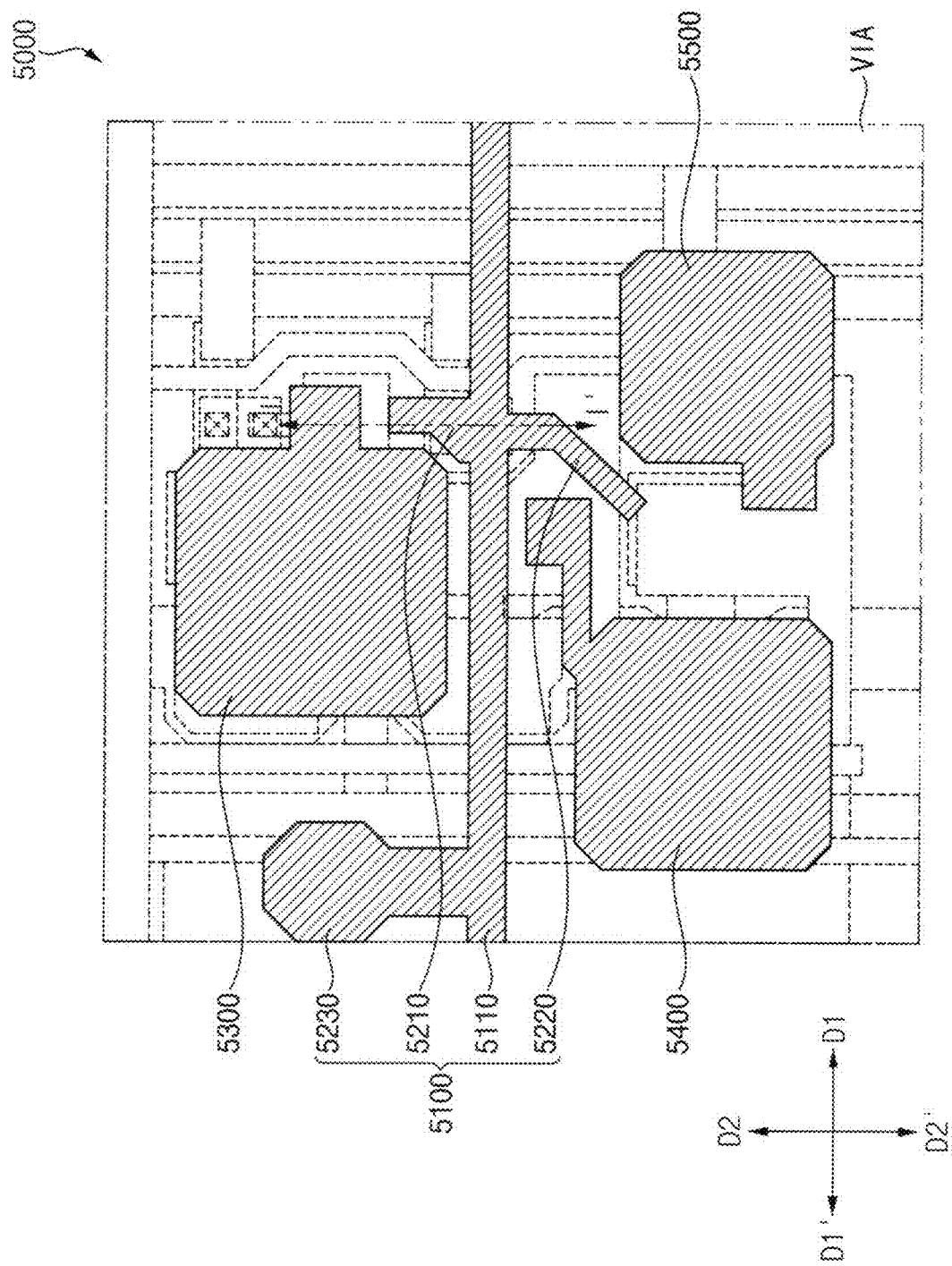

Referring to FIGS. 8 and 9, a via-insulating layer VIA may be disposed on the third conductive pattern 4000 and may cover the third conductive pattern 4000. The via-insulating layer VIA may include an insulating material. In an embodiment, the insulating material that may be used as the via-insulating layer VIA may be photoresist, polyacrylic resin, polyimide resin, acrylic resin, or the like.

A fourth conductive pattern 5000 may be disposed on the via-insulating layer VIA, and may include a common voltage pattern 5100, a first pixel electrode 5300, a second pixel electrode 5400, and a third pixel electrode 5500. In an embodiment, the common voltage pattern 5100 may be spaced apart from the first pixel electrode 5300, the second pixel electrode 5400, and the third pixel electrode 5500.

The common voltage pattern 5100 may include a line portion 5110, a first protrusion portion 5210, a second protrusion portion 5220, and a contact portion 5230. In an embodiment, the line portion 5110, the first protrusion portion 5210, the second protrusion portion 5220, and the contact portion 5230 may be unitary with each other. In other words, the line portion 5110, the first protrusion portion 5210, the second protrusion portion 5220, and the contact portion 5230 may be provided as one body.

The line portion 5110 may extend in the first direction D1 and may contact the common voltage connection pattern 4200. The line portion 5110 may be electrically connected to the common voltage line 1100 through the common voltage connection pattern 4200. Accordingly, the common voltage ELVSS may be provided to the common voltage pattern 5100. As the line portion 5110 extends in the first direction D1, a voltage drop of the common voltage ELVSS may be prevented.

The line portion 5110 may be disposed between the first pixel electrode 5300 and the second pixel electrode 5400. In addition, the line portion 5110 may be disposed between the first pixel electrode 5300 and the third pixel electrode 5500. In other words, the first pixel electrode 5300 may be disposed in the second direction D2 with respect to the line portion 5110, and the second and third pixel electrodes 5400 and 5500 may be disposed in the second opposite direction D2' with respect to the line portion 5110. However, the position where the line portion 5110 is disposed is not limited thereto.

The first protrusion portion 5210 may protrude from the line portion 5110 in the second direction D2. In other words, the first protrusion portion 5210 may protrude toward the first pixel electrode 5300. In addition, the first protrusion portion 5210 may overlap the second connection pattern 4620.

Accordingly, the first protrusion portion 5210 may shield the second connection pattern 4620 from the first pixel electrode 5300. In other words, as the first protrusion portion 5210 to which the common voltage ELVSS is provided is disposed between the first pixel electrode 5300 and the second connection pattern 4620, a parasitic capacitance between the first pixel electrode 5300 and the second connection pattern 4620 may be reduced. Accordingly, stability of the data voltage DATA transmitted to the second gate electrode 3420 through the second connection pattern 4620 may be improved.

The shape of the first protrusion portion 5210 is not limited thereto. In an embodiment, the first protrusion portion 5210 may be formed or provided to shield the second connection pattern 4620 from the first pixel electrode 5300, for example.

The second protrusion portion 5220 may protrude from the line portion 5110 in the second opposite direction D2'. In other words, the second protrusion portion 5220 may protrude toward the second pixel electrode 5400 and the third pixel electrode 5500. In addition, the second protrusion portion 5220 may be disposed between the second pixel electrode 5400 and the third pixel electrode 5500. In other words, the third pixel electrode 5500 may face the second pixel electrode 5400 with the second protrusion portion 5220 interposed therebetween.

Accordingly, the second protrusion portion 5220 may shield the third pixel electrode 5500 from the second pixel electrode 5400. In other words, as the second protrusion portion 5220 to which the common voltage ELVSS is provided is disposed between the second pixel electrode 5400 and the third pixel electrode 5500, a parasitic capacitance between the second pixel electrode 5400 and the third pixel electrode 5500 may be reduced. Accordingly, stability of the driving current transmitted to the third pixel electrode 5500 may be improved.

The shape of the second protrusion portion 5220 is not limited thereto. In an embodiment, the second protrusion portion 5220 may be formed or provided to shield the third pixel electrode 5500 from the second pixel electrode 5400, for example.

The contact portion 5230 may extend from the line portion 5110 in the second direction D2.

The first pixel electrode 5300 may contact the first anode pad 4510 through at least one contact hole. The second pixel electrode 5400 may contact the second anode pad 4520 through at least one contact hole. The third pixel electrode 5500 may contact the third anode pad 4530 through at least one contact hole. The first to third pixel electrodes 5300, 5400, and 5500 may receive the initialization voltage VINT or the driving current through the first to third anode pads 4510, 4520, and 4530, respectively.

Figure 10:
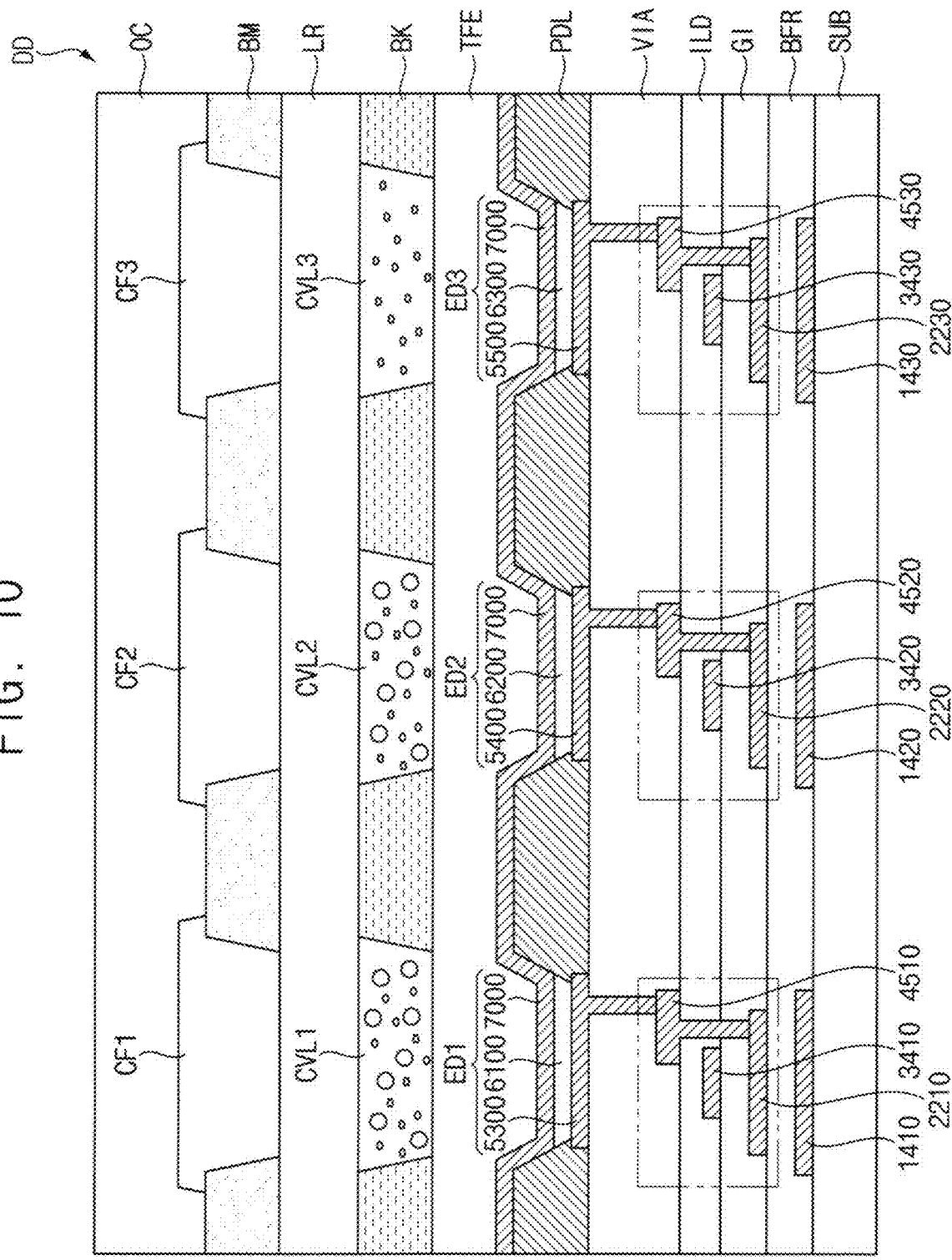
FIG. 10 is a cross-sectional view illustrating the display device of FIG. 1.
Figure 11:
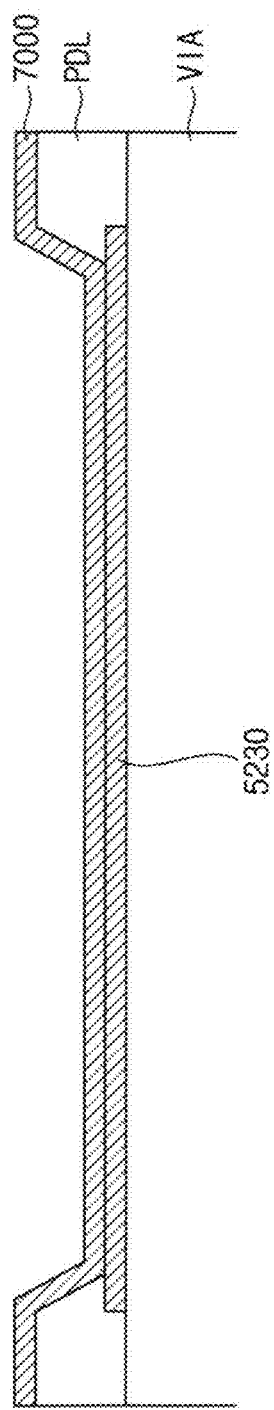
FIG. 11 is a cross-sectional view illustrating a contact portion and a common electrode included in the display device of FIG. 1.

FIG. 10 is a cross-sectional view illustrating the display device of FIG. 1. FIG. 11 is a cross-sectional view illustrating a contact portion and a common electrode included in the display device of FIG. 1.

Referring to FIGS. 10 and 11, the display device DD may include the substrate SUB, the first to third capacitor electrode patterns 1410, 1420, and 1430, the fourth to sixth semiconductor patterns 2210, 2220, and 2230, the first to third gate electrodes 3410, 3420, and 3430, the first to third anode pads 4510, 4520, and 4530, the first to third pixel electrodes 5300, 5400, and 5500, a first emission layer 6100, a second emission layer 6200, a third emission layer 6300, a common electrode 7000, an encapsulation layer TFE, a bank layer BK, a first color conversion layer CVL1, a second color conversion layer CVL2, a third color conversion layer CVL3, a refractive layer LR, a light-blocking layer BM, a first color filter CF1, a second color filter CF2, a third color filter CF3, and a planarization layer OC. Hereinafter, overlapping descriptions will be omitted.

The pixel defining layer PDL may be disposed on the via-insulating layer VIA. The pixel defining layer PDL may include an insulating material. In an embodiment, the insulating material that may be used as the pixel defining layer PDL may include photoresist, polyacrylic resin, polyimide resin, acrylic resin, or the like. These may be used alone or in combination with each other.

An opening exposing the first pixel electrode 5300, the second pixel electrode 5400, the third pixel electrode 5500, and the contact portion 5230 may be formed or provided in the pixel defining layer PDL.

The first emission layer 6100 may be disposed on the first pixel electrode 5300, the second emission layer 6200 may be disposed on the second pixel electrode 5400, and the third emission layer 6300 may be disposed on the third pixel electrode 5500. The first emission layer 6100, the second emission layer 6200, and the third emission layer 6300 may include an organic material and may emit light of a preset color. In an embodiment, the first emission layer 6100 may emit green light, the second emission layer 6200 may emit red light, and the third emission layer 6300 may emit blue light, for example.

The common electrode 7000 may be disposed on the first to third emission layers 6100, 6200, and 6300. The common electrode 7000 may be a plate electrode. In an embodiment, the common voltage ELVSS may be provided to the common electrode 7000. In an embodiment, as shown in FIG. 11, the common electrode 7000 may contact the contact portion 5230 through the opening penetrating the pixel defining layer PDL and exposing the contact portion 5230, for example. Accordingly, the same common voltage ELVSS may be provided to the common voltage pattern 5100 and the common electrode 7000.

The first pixel electrode 5300, the first emission layer 6100, and the common electrode 7000 may constitute a first light-emitting diode ED1. In an embodiment, the first light-emitting diode ED1 may correspond to the light-emitting diode LED described with reference to FIG. 3, for example. In addition, the second pixel electrode 5400, the second emission layer 6200, and the common electrode 7000 may constitute a second light-emitting diode ED2. The third pixel electrode 5500, the third emission layer 6300 and the common electrode 7000 may constitute a third light-emitting diode ED3.

The encapsulation layer TFE may be disposed on the common electrode 7000. The encapsulation layer TFE may include an insulating material. In an embodiment, the encapsulation layer TFE may have a structure in which inorganic layers and organic layers are alternately stacked, for example. The encapsulation layer TFE may prevent foreign substances from penetrating into the first to third emission layers 6100, 6200, and 6300.

The bank layer BK may be disposed on the encapsulation layer TFE. The bank layer BK may include a light-blocking material and may block light emitted from a lower portion. In addition, an opening exposing the encapsulation layer TFE may be defined in the bank layer BK.

The first color conversion layer CVL1 may overlap the first emission layer 6100. In an embodiment, the first color conversion layer CVL1 may convert a wavelength of light emitted from the first emission layer 6100. In an embodiment, the first color conversion layer CVL1 may include a phosphor, a scatterer, or quantum dots, for example. As the light emitted from the first emission layer 6100 passes through the first color conversion layer CVL1, green light may be emitted.

The second color conversion layer CVL2 may overlap the second emission layer 6200. In an embodiment, the second color conversion layer CVL2 may convert a wavelength of light emitted from the second emission layer 6200. In an embodiment, the second color conversion layer CVL2 may include a phosphor, a scatterer, or quantum dots, for example. As the light emitted from the second emission layer 6200 passes through the second color conversion layer CVL2, red light may be emitted.

The third color conversion layer CVL3 may overlap the third emission layer 6300. In an embodiment, the third color conversion layer CVL3 may scatter a wavelength of light emitted from the third light-emitting layer 6300. In an embodiment, the third color conversion layer CVL3 may include a transparent polymer material, a scatterer, or the like, for example. As the light emitted from the third emission layer 6300 passes through the third color conversion layer CVL3, blue light may be emitted.

In an embodiment, the refractive layer LR may be disposed on the first to third color conversion layers CVL1, CVL2, and CVL3. The refractive layer LR may have a predetermined refractive index. Accordingly, the light efficiency of the display device DD may be improved. In another embodiment, the refractive layer LR may be disposed below the first to third color conversion layers CVL1, CVL2, and CVL3. In another embodiment, the refractive layer LR may include first and second refractive layers, the first refractive layer is disposed on the first to third color conversion layers CVL1, CVL2, and CVL3, and the second refractive layer may be disposed below the first to third color conversion layers CVL1, CVL2, and CVL3.

The light-blocking layer BM may be disposed on the refractive layer LR. The light-blocking layer BM may include a light-blocking material, and may block light emitted from the lower portion. In addition, an opening exposing the refractive layer LR may be defined in the light-blocking layer BM.

The first color filter CF1 may overlap the first color conversion layer CVL1. In an embodiment, the first color filter CF1 may transmit light having a wavelength corresponding to green light.

The second color filter CF2 may overlap the second color conversion layer CVL2. In an embodiment, the second color filter CF2 may transmit light having a wavelength corresponding to red light.

The third color filter CF3 may overlap the third color conversion layer CVL3. In an embodiment, the third color filter CF3 may transmit light having a wavelength corresponding to blue light.

The planarization layer OC may be disposed on the first to third color filters CF1, CF2, and CF3. The planarization layer OC may include an organic material and may provide a substantially flat upper surface.

Figure 12:
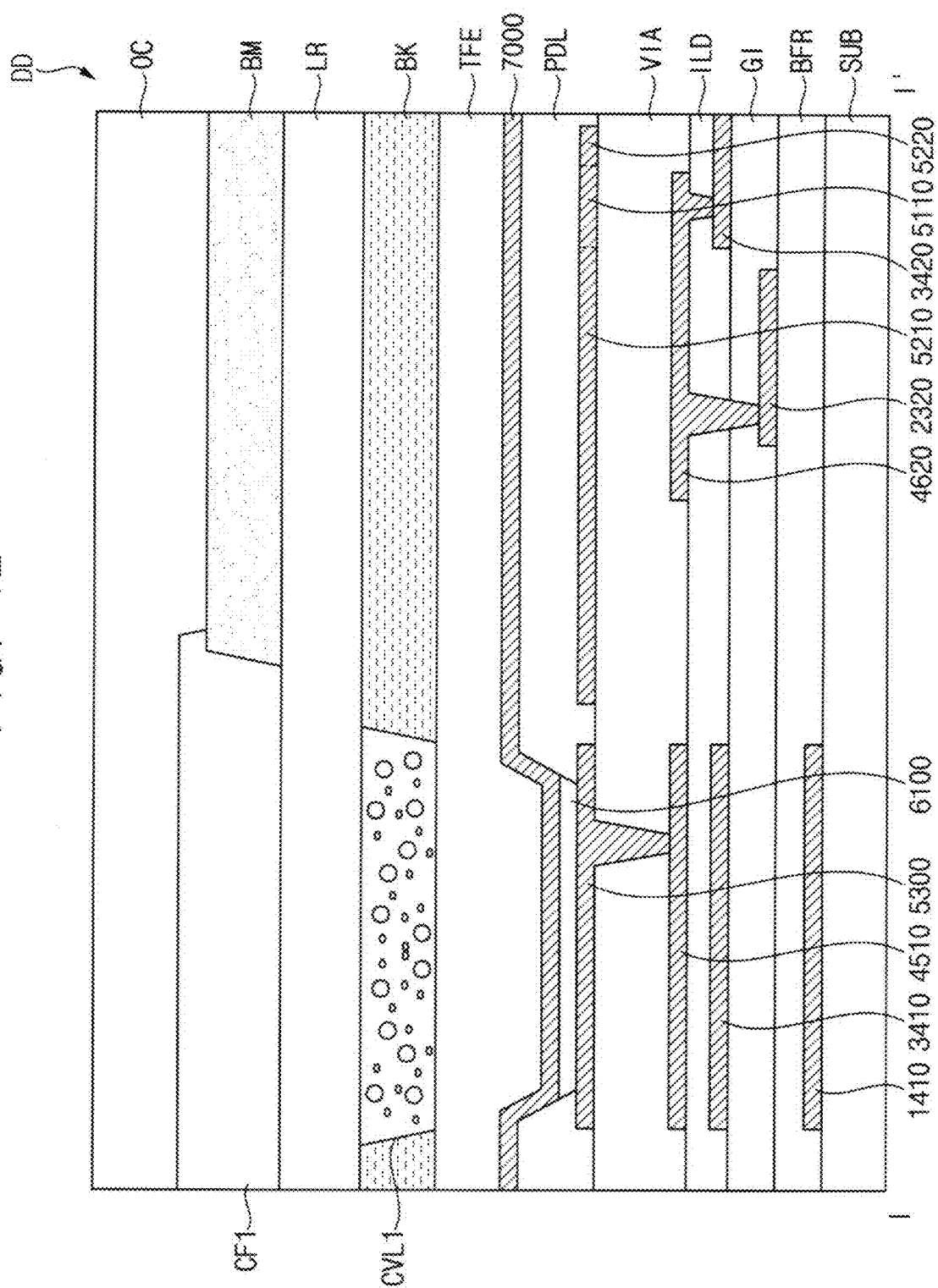
FIG. 12 is a cross-sectional view taken along line I-I' of FIG. 9.

FIG. 12 is a cross-sectional view taken along line I-I' of FIG. 9.

Referring to FIGS. 9 and 12, the line portion 5110 may overlap the second gate electrode 3420. In addition, as described above, the first protrusion portion 5210 may protrude from the line portion 5110 toward the first pixel electrode 5300. Accordingly, the first protrusion portion 5210 may be disposed between the first pixel electrode 5300 and the second connection pattern 4620. As the first protrusion portion 5210 to which the common voltage ELVSS is provided is disposed between the first pixel electrode 5300 and the second connection pattern 4620, the parasitic capacitance between the first pixel electrode 5300 and the second connection patterns 4620 may be reduced.

Although the embodiments have been described herein, other embodiments and modifications will be apparent from this description. Accordingly, the invention is not limited to such embodiments, but rather to the broader scope of the appended claims and various obvious modifications and equivalent arrangements as would be apparent to a person of ordinary skill in the art.

What is claimed is:

1. A display device comprising:
   a first active pattern disposed on a substrate;
   a second active pattern disposed on the substrate;
   a first connection pattern disposed on the first active pattern and contacting the first active pattern;
   a second connection pattern disposed on the second active pattern and contacting the second active pattern;
   a first pixel electrode disposed on the first connection pattern;
   a second pixel electrode disposed on the second connection pattern;
   a common voltage pattern disposed on the second connection pattern, the common voltage pattern including:
      a line portion extending in a first direction defining a plan view; and
      a first protrusion portion protruding from the line portion in the plan view and overlapping the second connection pattern in a cross-sectional view;
   an emission layer disposed on the common voltage pattern; and
   a common electrode disposed on the emission layer and electrically and directly connected to the common voltage pattern,
   wherein the second active pattern is spaced apart from the first active pattern in the plan view,
   the second pixel electrode is spaced apart from the first pixel electrode in the plan view, and
   the common voltage pattern is spaced apart from the second pixel electrode in the plan view.

2. The display device of claim 1, wherein the first protrusion portion protrudes in a second direction intersecting the first direction and defining the plan view together with the first direction.

3. The display device of claim 1, wherein the first protrusion portion protrudes toward the first pixel electrode.

4. The display device of claim 1, wherein the first protrusion portion is unitary with the line portion.

5. The display device of claim 1, further comprising:
a first gate electrode disposed on the first active pattern and contacting the first connection pattern; and
a second gate electrode disposed on the second active pattern,
wherein the second gate electrode is spaced apart from the first gate electrode in the plan view, and contacts the second connection pattern.

6. The display device of claim 5, wherein the line portion overlaps the second gate electrode.

7. The display device of claim 5, wherein the first connection pattern connects the first active pattern and the first gate electrode, and
wherein the second connection pattern connects the second active pattern and the second gate electrode.

8. The display device of claim 1, further comprising:
a first data line disposed on the substrate, extending in a second direction intersecting the first direction and defining the plan view together with the first direction, and connected to the second active pattern; and
a second data line disposed on the substrate, extending in the second direction, spaced apart from the first data line in the plan view, and connected to the first active pattern.

9. The display device of claim 8, further comprising:
a first data pattern disposed in a same layer as the first connection pattern and connecting the first active pattern and the second data line; and
a second data pattern disposed in a same layer as the second connection pattern and connecting the second active pattern and the first data line.

10. The display device of claim 1, further comprising:
a gate line disposed on the first active pattern and overlapping the first active pattern and the second active pattern,
wherein the gate line extends in a second direction intersecting the first direction and defining the plan view together with the first direction.

11. The display device of claim 10, further comprising:
a gate connection line disposed on the gate line, extending in the first direction, and connected to the gate line.

12. The display device of claim 1, wherein the common voltage pattern further includes a second protrusion portion, and
wherein the second protrusion portion protrudes from the line portion and extends in a direction opposite to an extension direction of the first protrusion portion.

13. The display device of claim 12, wherein the second protrusion portion is unitary with the line portion and the first protrusion portion.

14. The display device of claim 12, further comprising:
a third pixel electrode facing the second pixel electrode with the second protrusion portion interposed therebetween.

15. The display device of claim 14, wherein the common voltage pattern is disposed in a same layer as the first pixel electrode, the second pixel electrode, and the third pixel electrode.

16. The display device of claim 1, wherein the first pixel electrode is electrically connected to the first connection pattern, and
wherein the second pixel electrode is electrically connected to the second connection pattern.

17. The display device of claim 1, wherein the line portion is disposed between the first pixel electrode and the second pixel electrode, in the plan view.

18. The display device of claim 1, wherein the first protrusion portion shields the second connection pattern from the first pixel electrode.

19. A display device comprising:
a first active pattern disposed on a substrate;
a second active pattern disposed on the substrate;
a first connection pattern disposed on the first active pattern and contacting the first active pattern;
a second connection pattern disposed on the second active pattern and contacting the second active pattern;
a first pixel electrode disposed on the first connection pattern;
a second pixel electrode disposed on the second connection pattern;
a common voltage pattern disposed on the second connection pattern, the common voltage pattern including:
a line portion extending in a first direction defining a plan view; and
a first protrusion portion protruding from the line portion in the plan view and overlapping the second connection pattern in a cross-sectional view;
an emission layer disposed on the common voltage pattern; and
a common electrode disposed on the emission layer and connected to the common voltage pattern,
wherein the second active pattern is spaced apart from the first active pattern in the plan view,
the second pixel electrode is spaced apart from the first pixel electrode in the plan view, and
the common voltage pattern is spaced apart from the second pixel electrode in the plan view, wherein the common voltage pattern is disposed in a same layer as the first pixel electrode and the second pixel electrode.

20. A display device comprising:
a first active pattern disposed on a substrate;
a second active pattern disposed on the substrate;
a first connection pattern disposed on the first active pattern and contacting the first active pattern;
a second connection pattern disposed on the second active pattern and contacting the second active pattern;
a first pixel electrode disposed on the first connection pattern;
a second pixel electrode disposed on the second connection pattern;
a common voltage pattern disposed on the second connection pattern, the common voltage pattern including:
a line portion extending in a first direction defining a plan view; and
a first protrusion portion protruding from the line portion in the plan view and overlapping the second connection pattern in a cross-sectional view;
an emission layer disposed on the common voltage pattern; and
a common electrode disposed on the emission layer and connected to the common voltage pattern,
wherein the second active pattern is spaced apart from the first active pattern in the plan view,
the second pixel electrode is spaced apart from the first pixel electrode in the plan view, and the common voltage pattern is spaced apart from the second pixel electrode in the plan view, wherein the common voltage pattern and the common electrode are applied with a same common voltage.

* * * * *